United States Patent

Siebold et al.

[11] Patent Number: 4,799,017
[45] Date of Patent: Jan. 17, 1989

[54] BACKGROUND FIELD MAGNET FOR IMAGE GENERATING DEVICES USING NUCLEAR SPIN RESONANCE

[75] Inventors: Horst Siebold, Erlangen; Franz Strahwald, Ebermannstadt, both of Fed. Rep. of Germany

[73] Assignee: Siemens Aktiengesellschaft, München, Fed. Rep. of Germany

[21] Appl. No.: 24,814

[22] Filed: Mar. 12, 1987

[30] Foreign Application Priority Data

Mar. 19, 1986 [DE] Fed. Rep. of Germany ....... 3609226

[51] Int. Cl.$^4$ .............................................. G01R 33/20
[52] U.S. Cl. .................................... 324/319; 335/299
[58] Field of Search ............... 324/318, 319, 320, 322, 324/307, 309; 335/299, 300; 336/208, DIG. 1

[56] References Cited

U.S. PATENT DOCUMENTS

| 4,385,277 | 5/1983 | Hanley | 324/309 |
| 4,506,247 | 3/1985 | Vermilyea | 324/320 |
| 4,584,548 | 4/1986 | Inoue et al. | 324/320 |

Primary Examiner—Stewart J. Levy
Assistant Examiner—Kevin D. O'Shea
Attorney, Agent, or Firm—Kenyon & Kenyon

[57] ABSTRACT

A background field magnet for image transmitting devices of nuclear spin tomography is designed for the generation of a magnetic background field of predetermined first field strength and contains on a tubular coil support, and six super-conductive single coils which are arranged in pairs symmetrically with respect to a plane of symmetry at predetermined median distances from the plane. The coil support is also suitable for the generation of a second field strength which is smaller than the first field. According to the invention, it is provided that on the coil support (25) the coils (11, 12, 14) are applied with the same median distances ($z_1$, $z_2$, $z_4$) with respect to the plane of symmetry (S), however, with reduced winding numbers ($N_1'$, $N_2'$, $N_2'$), that additionally a pair (P3) of serially switched auxiliary coils (13) is provided which each is placed in the vicinity of the outer single coils (14) on the coil former (25) and that with given reduced winding number ($N_4'$) of the outer single coils (14) under consideration of their original outer radius ($R_4$) and a change of the conductor cross section (from $q_4$ to $q_4'$) as well as with the median distance ($z_3$) and the center radius ($R_3$) of the auxiliary coils (13) given, the further winding numbers ($N_1'$, $N_2'$, $N_3'$) of the corresponding coils (11 to 13) by using the winding number ($N_1$, $N_2$, $N_4$) resulting for the first field strength have to be determined according to given mathematical relations.

11 Claims, 2 Drawing Sheets

BACKGROUND FIELD MAGNET FOR IMAGE GENERATING DEVICES USING NUCLEAR SPIN RESONANCE

BACKGROUND OF THE INVENTION a. Field of Invention

The invention concerns a background field or base net for image generating (imaging) devices using nuclear spin resonance technology (such as nuclear spin tomography) and more particularly to a device which contains at least six annular super-conductive single (individual) coils arranged on a tubular coil support along a common axis placed behind each other with which, within an image region, a background magnetic field of a first predetermined field strength and sufficient homogeneity is generated. These single coils have predetermined ampere turns and are arranged in pairs at a equal distances with respect to a plane of symmetry which runs through the center of the image region perpendicular to the common axis. More particularly a pair of inner, middle, and outer single coils formed, spaced at increasing distances from the plane of symmetry.

b. Description of the Prior Art

A field magnet similar to the one described above is found in U.S. Pat. No. 4,385,277.

In the area of medical diagnosis, image generating processes have been developed in which integral resonance signals of nuclei of a given element of a body, particularly a human body or body part are analyzed by actual measurement, or by computation. From the spatial spin density and/or relaxation time distribution a image can be constructed similar to a x-ray-tomogram. The corresponding processes are known as "nuclear spin tomography" (nuclear magnetic resonance tomography) or "zeugmatography".

For nuclear spin tomography, a strong magnetic field generated by a so-called background field magnet which, within an image or examination region of predetermined extent, should be as homogeneous as possible. The body to be examined is introduced within said region along an axis which is general coincides with the orientation axis of the magnetic field. This field is superimposed by stationary and/or pulsed gradient fields. For the excitation of the individual atomic nuclei in the body into nuclear precession, a special antenna device is required in addition with which, temporarily, a high frequency magnetic alternating field can be produced. Frequently, the antenna is also used to receive the HF-signals to be regenerated if no special measuring coils are provided for that purpose.

The background field magnet can, in particular, consist of six annular superconductive single coils aligned in the direction of the magnet field orientation. The coils are arranged adjacent to each other, on a common coil support. The support has grooves for holding the coils as described in U.S. Pat. No. 4,385,277 mentioned above. These grooves are arranged in pairs symmetrically and in predetermined median distances from a plane of symmetry which runs perpendicularly to the orientation axis. The windings of the single coils are placed into the grooves. The individual distances of the grooves from the plane of symmetry, the number of the conductor windings of the single coils to be inserted, and the maximal current flowing through coils are determined from the desired field strength of the magnet in a known manner (see "Journal of Applied Physics", Vol 38, No. 6, May 1967, pages 2563 to 2586). Thus, for a given background field magnet with a coil support having known dimensions for a desired field strength, the individual parameters mentioned above are specifically defined. The field magnet described above is, in addition, fitted with a number of additional coils. These additional coils are electrically isolated from and are excited independently of the first six single coils.

For the nuclear spin tomography super-conductive background field magnets are employed of the same dimensions but intended for different operating field strengths corresponding to magnetic inductions of, for example 0.5 T to 2T. Since the superconductive material for the single coils for this purpose is very expensive and has a physically and technically predetermined maximum current carrying capacity, background field magnets of different strength require different cross sections for their windings, i.e., these single magnets have to be manufactured with different electric ampere turns. Since, furthermore, for nuclear spin tomography, the background magnetic fields in the effective image region have to be extremely homogeneous, the spatial position of each single coil has to be aligned for each designed field strength. In addition, the cross sectional area of winding and its ampere turns must also be changed. This, however, generally necessitates a new coil support with different dimensions fashioned for each desired field strength. The consequences are costly, and storage space as well as long lead times from ordering to delivery of the magnets are required.

SUMMARY OF THE INVENTION

It is therefore the objective of the present invention to produce a coil support of the above mentioned kind suitable for background field magnets of different field strengths with relatively little expenditure.

On the coil support of the background field magnet, according to the invention, the position of the single coils is determined exactly for a magnet having a first field strength. The coils are provided in pairs arranged symmetrically with respect to a plane of symmetry. In such a system, with three coil pairs, the designer has at his disposal three ampere turns (winding numbers) and three coil positions, yielding six degrees of freedom for the generation of the background magnet and for the elimination of the five first even harmonic terms or coefficients of the magnetic field in the known manner. For generating a second magnet with a lesser field strengths the same coil support may be used, however, only two degrees of freedom remain for the elimination of field harmonics if the same coil positions are reused. This leads, however, to unacceptable high field strength harmonics. With the introduction of an additional or auxiliary coil pair, according to the invention, an advantageous additional degree of freedom is regained. The overall field errors or harmonics can be kept small. Therefore this coil support may be used for constructing magnets of lower field strengths and sufficient homogeneity by selecting the parameters of additional coil pairs, and by changing the ampere turns of the inner and middle coil pairs. The changes are made dependent on the selection of the ampere turns of the outer single coil, its original outer radius, on the cross section of the conductor used, as well as on the position and the center radius of the additional coils. The advantages associated with the design of the background field magnet according to the invention is seen in that the coil support can be used for magnets of different field strengths.

BRIEF DESCRIPTION OF THE FIGURES

Reference is now made to the figures wherein.

DETAILED DESCRIPTION OF THE INVENTION

Figure 1:
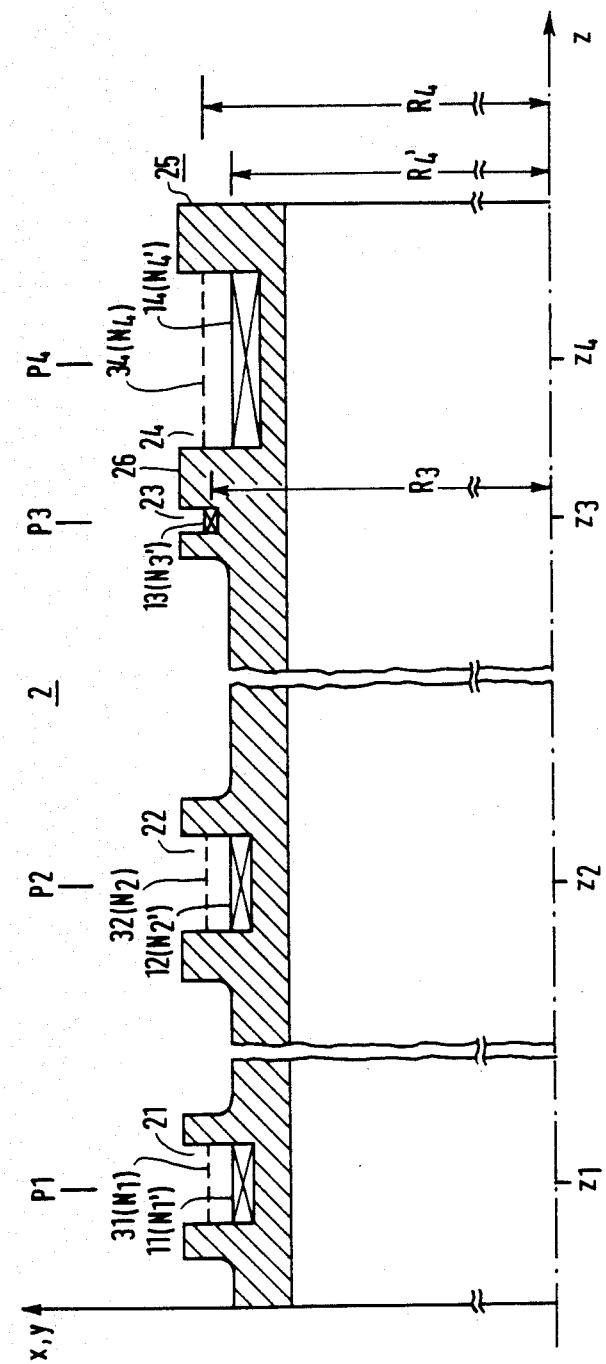
FIG. 1 shows a longitudinal section through a portion of a background field magnet according to the invention.

The field magnet shown in FIG. 1 generally labeled 2 contains a system of super-conductive single coils arranged concentrically with respect to the horizontal z-axis of a rectangular x-y-z coordinate system for the generation of a background magnetic field in the z direction. This field is homogeneous in an image region corresponding to the origin of the coordinate system. The background field magnet allows an axial access to this homogeneous image region, i.e., a body to be examined, For instance, a human body may be introduced along the z-axis into the field area.

The background field magnet 2 advantageously comprises six annular single (individual) coils arranged serially along the z-axis, arranged in three pairs P1, P2, and P4 symmetrically with respect to plane S, which plane S coincides with the x and y axes of the coordinate system. In the figure only the parts of the ground field magnet disposed to the regret of planes and above the z-axis are described in detail. The inner coil pair P1, which is near to the plane of symmetry S, is shown by its single coil 11, the outer coil pair P4 only by its single coil 14 and the intermediate, middle coil pair P2 by its single coil 12.

According to the invention, an additional pair P3 of auxiliary or additional coils are provided which are located in the vicinity of the outer coil pair P4 and which is shown in the figure by its coil 13. These auxiliary coils are not fed by a separate current supply but may be serially connected switched to single coils 11, 12 and 14 and thus do not require additional current leads as described more fully below. All coils 11 to 14 of the coil pairs P1 to which can be fashioned advantageously from one uniform super-conductor and are inserted from the outside into corresponding grooves 21 to 24 of massive hollow cylindrical coil support 2. The median distances of these grooves 21 to 24, and therefore coils 11 to 14 located therein, with respect to the plane of symmetry S are indicated in the figure along the z-axis as z1 to z4.

According to the invention, the design of the coil support 25 is based on the concept that field magnets of different magnetic field strengths with respectively magnetic inductions can be constructed with this support. The individual ampere turns of the coils of each coil pairs, as well as their position with respect to the plane of symmetry is related to the maximum field strength of the background field magnet. A first field magnet is generated only by the three pairs P1, P2 and P4 in response to a first current, with pair P3 remaining idle. The median distances z1, z2 and z4 with respect to the plane of symmetry S as well as their ampere turns at given current can be determined in a known manner. (See the cited literature in reference "Journ. Appl. Phys."). The values of the median distances z1, z2 and z4, for the winding numbers $N_1$, $N_2$, and $N_4$ of the corresponding single coils as well as the value of the cross section $q_4$ of the conductor of the outer single coils 14 are thus given as a function of the field strength of the first magnet. In FIG. 1 a background field magnet of this first field strength is generated by hatched single coils 31, 32 and 34. The resulting outer radius of the outermost single coils 34 is designated by $R_4$.

Alternatively, on the same coil support 25, a second field magnet may be built, which in response to a second current generates a field having a second field strength smaller than the field strength of the first whereby into the same grooves 21, 22 and 24, the single coils 11, 12 and 14 are wound with lower winding numbers $N_1'$, $N_2'$, and $N_4'$. The median distances z1, z2, and z4 of the single coils 11, 12 and 14 from the plane of symmetry S as well as their inner radius are thus unchanged. Since, additionally, the current load capacity of the super-conductive conductors from which these single coils are to be wound depends on cross section and on other parameters of the conductor, (such as the ratio of superconductor material to stabilization material, technology of fabrication, etc.), a conductor with a cross section $q_4'$ for the outer coil pairs can be chosen.

Furthermore, for the second magnet a coil with a lower winding number $N_4'$, is used in groove 24. The ratio $N_4'/N_4$ is hereafter designated as A. If, furthermore, a different conductor cross section $q_4'$ is selected, the outer radial outer dimension of the outer single coils 14 is reduced the factor $$B = N_4' \cdot q_4 / N_4 q_4 = A q_4'/q_4$$

Instead of the original outer radius R of the single coils 34, a correspondingly reduced $R_4'$ results. In the embodiment of FIG. 1, B is approximately 0.5. Alternatively, if one uses advantageously the same conductor as for the first magnet, then it follows that $A = B$.

In addition, the auxiliary coil pair is switched in series with coils P1, P2, P4 for the second magnet in order to correct the field errors associated with maintaining the positions $z_1$, $z_2$, and $z_4$ for the coils pairs P1, P2, and P4. The groove 23 for corresponding additional coils 13 is advantageously placed in the vicinity of the groove 24. Hereby aspects of a mechanical sufficiently rigid support of the individual coils in the grooves must be taken into consideration. The separating walls 26 between the grooves 23 and 24 must, as seen in an axial direction, be wide enough to assume that single coils 14 do not drift. Nevertheless, some freedom exists in the selection of the center position $z_3$ of the additional coils 13 and their center radius $R_3$. Individual preferences in regard to design of the coil support can be considered. It is especially advantageous if in the selection of the distance $z_3$ and/or of the radius $R_3$ the following ratios, at least approximately, are taken as a basis:

$$z_3/z_4 = 0.831;$$

$$R_3/R_4 = 1.0$$

Figure 2:
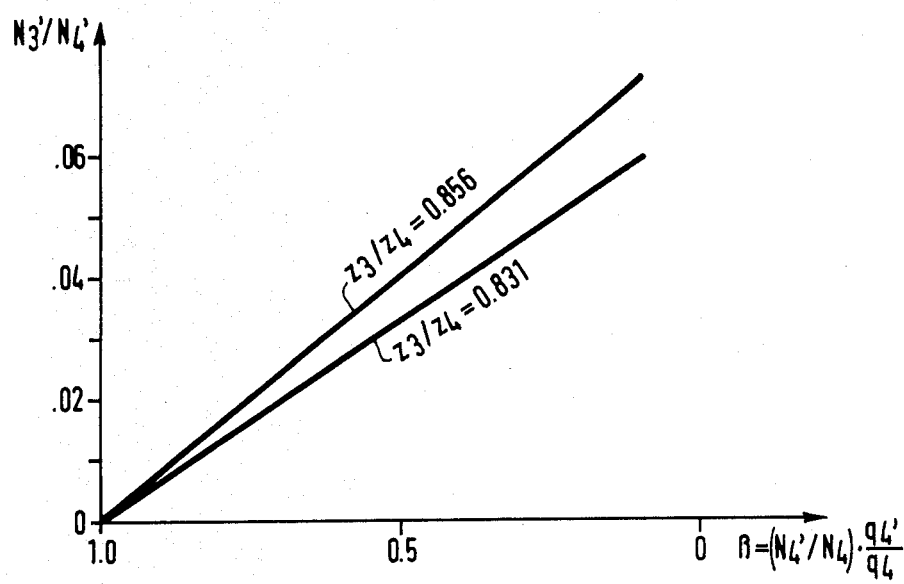
FIGS. 2 and 3 each show correction values for changing the ampere turns of some coils of these magnets.

In addition to the distance $z_1$ to $z_4$, the values $N_1$ to $N_4$, $R_3$, $R_4$ and $N_4'$ as well as $q_4$ and $q_4'$, are also predetermined. Starting with these values, in order to determine the winding number $N_3'$ of the additional coils 13 of the coil pair P3, reference is made to the diagram of FIG. 2. In this diagram the reduction factor B is shown as the abscissa and the ratio $N_3'/N_4'$ as the ordinate. The diagram shows two curves for different ratios $z_3/z_4$. On the basis of these curves for the winding number $N_3'$ the following generally applicable correlation is obtained, which holds also for conductor cross sections $q_4'$:

$$N_3'/N_4' = H_1 \cdot K_1 \cdot K_2$$

Where:

$$H_1 = (1-p) \, 0.006$$

$$K_1 = 1 + (z_3/z_4 - 0.831) \, 9.08 \text{ and}$$

$$K_2 = R_3/R_4.$$

The member $H_1$ describes the main effect of the correction, while $K_1$ and $K_2$ cause a first, and second fine correction. The second fine correction results from the lowering of the necessary electric ampere turns $N_3'$ by a smaller additional coil radius $R_3$.

Figure 3:
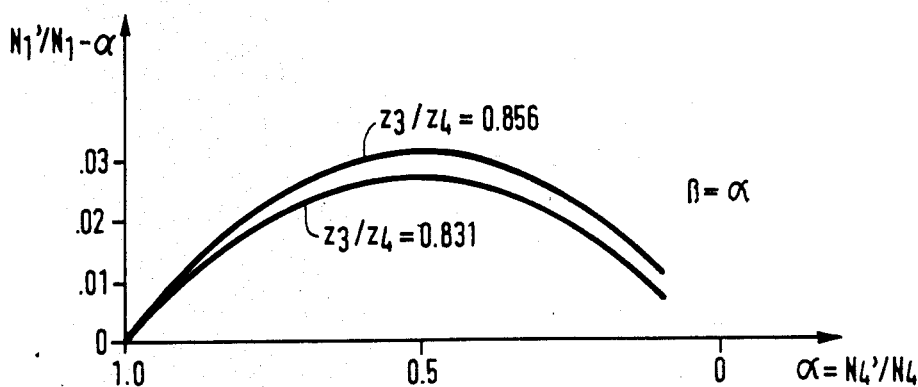

Additionally, the winding of the single coils 11 of the innermost coil pair $P_1$ has to be selected in accordance with the curves shown in the diagram of FIG. 3, somewhat larger than would correspond to the reduction factor A respectively B of the outer single coils 14. In this diagram, corresponding to FIG. 2, the two curves $(N_1'/N_1)$ - A resulting from using two different values of $z_3/z_4$ are drawn, with A=B. The quadratic function of this curves related to A is comprehensible. As a first approximation, the windings $N_3'$ of the auxiliary coils 13 can be added to the adjacent winding of the outer single coils 14 which are in close vicinity so that in each case the sum of the winding numbers $N_3' + N_4'$ has to be considered in comparison to the winding of the inner single coils 11. An exact calculation with the course of the two curves shown in the diagram of FIG. 3 gives the following correlation:

$$(N_1,N_1) - A = H_2 \cdot K_3 \cdot K_4$$

with
$H_2 = 0.104A \, (1-B)$
$K_3 = 1 + 5.92 \, (z_3/z_4 - 0.831)$ and
$K_4 = K_2$.

$H_2$ represents the main correction member of this correlation, while $K_3$ means a first correction factor, and $K_4$ a second correction factor.

For the winding numbers $N_2'$ of the coils 12 of the middle coil pair $P_2$ correction rules result identical to those for the determination of $N_1'$.

By using the above mentioned correlations for the determination of the winding numbers $N_1'$, $N_2'$ and $N_3'$, a magnetic field sufficiently homogeneous for nuclear spin tomography in the image region with an acceptable residual error of 8th Order can be obtained. In general, the requirements of the field homogeneity are not so extremely stringent in this case of lower field strengths. With these field strengths, in general, images are possible only by using the nuclear spin resonance of protons but not a spectroscopy of other nuclei like phosphorus.

In the embodiment on which the figures are based, it was assumed that the outer single coils 14 were wound from the same super-conductor as was used for both the first and the second magnet that $q_4' = q_4$.

In general, this is preferable. However, if necessary, it is possible to use a smaller cross section $q_4'$ if, for instance, a similar or the same operating current with a higher median effective current density is desired. Undesirable interference is caused by the reduction of the geometric radial thickness respectively the outer radius of the single coils of the outer coil pair P4, whereby $$B = R_4'/R_4$$

With similar winding techniques this can be eliminated by a reduction of the winding number N and/or by a reduction of the conductor cross section q, as follows:

$$B = (N_4'/N_4) \cdot (q_4'/q_4) = A \, q_4'/q_4$$

whereby $A = N_4'/N_4$

In the embodiment shown, the furthermore assumption was made that the coil support 25 consist of one piece with the grooves 21 to 24 are formed on its outer surface. If it becomes necessary, however, a corresponding multipart coil support can be used. For example, the grooves can be formed between annular cross pieces which are arranged on the outside of an annular supporting structure.

What is claimed is:
1. A background field magnet for image generating devices using nuclear spin resonance comprising:
   a. a coil support with a longitudinal axis; and
   b. one of a first and second set of primary coils, wherein:
      i. said first set of primary coils comprises at least a first, second and third primary coil pair disposed on said coil support, each coil pair comprising two coils, the coils of said first, second and third primary coil pair being symmetrically at a respective first, second and third distance from a plane of symmetry perpendicular to said longitudinal axis on said coil support, said coil pairs having a first preselected set of corresponding ampere-turns (N1, N2, N4), and cross-sections, said first set of primary coils producing a first homogenous field of a first intensity in response to a first current; and
      ii. said second set of primary coils comprises at least a first, second, third and an additional primary coil pair disposed on said coil support, each coil pair comprising two coils, the coils of said first, second, third and additional primary coil pairs being disposed symmetrically at a respective first, second, third and fourth distance from said plane of symmetry, said first, second and third distances being substantially equal to the distances of the first, second and third coil pairs of said first set, respectively, to said plane of symmetry, said coil pairs of the second set having a second preselected set of corresponding ampere-turns (N1', N2', N4' and N3'), and cross-sections, said second set of primary coils producing a second homogenous field of a second intensity lower than said first intensity in response to a second current.

2. The magnet of claim 1 wherein each of said additional coils is disposed between the coils of said second and third coil pairs, respectively, the third coil pair being the furthest from said plane.

3. The magnet of claim 1 wherein said additional coils have an additional ampere turn $N_3'$, and wherein said coils are related by the equations:

$$N_3'/N_4' = 0.066 \quad (1-B)[1+9.08(Z_3/Z_4-0.831)](R_3/R_4); \tag{a}$$

$$N_2'/N_2 - A = N_1'/N_1 - A = 0.104\, A\, (1-B)[1+5.92\,(Z_3/Z_4 - 0.831)]\,(R_3/R_4) \quad (b)$$

where $B = A\,(q_4'/q_4)$;

$A = N_4'/N_4$;

$q_4$ and $q_4'$ are the cross sections of the conductors of the third pair of products corresponding to the electric ampere turns of $N_4$ and $N_4'$; $Z_3$ and $R_3$ are respectively the median distance from the pair and the center radius of the additional coils; and $Z_4$ and $R_4$ are respectively the median distance from the plane and the outer radius of the third pair of primary coils.

4. The background field magnet according to claim 1, wherein said coils are arranged in grooves formed in said coil support.

5. The background field magnet according to claim 3 wherein said median distance ($z_3$) of the said additional coils (13) is at least approximately 0.831 times the median distance ($z_4$) of the third primary coils.

6. The background field magnet according to claim 3 wherein said median radius ($R_3$) of the additional coils is selected at least approximately equal to the original outer radius ($R_4$) of the third single coils.

7. The background field magnet according to claim 1 wherein said coils are wound of a uniform superconductor.

8. The background field magnet according to claim 7 wherein said first and second sets of coils have a first cross-section determined from said first intensity.

9. The background field magnet according to claim 1, wherein said second current is predetermined.

10. The background field magnet according to claim 1, wherein said first current and said second current are equal.

11. The background field magnet according to claim 3, wherein the median distance $z_3$ from the plane and the median radius $R_3$ of the additional coils are predetermined.

* * * * *